US011916169B2

(12) United States Patent
Pinos et al.

(10) Patent No.: US 11,916,169 B2
(45) Date of Patent: Feb. 27, 2024

(54) ACTIVE MATRIX LED ARRAY

(71) Applicant: PLESSEY SEMICONDUCTORS LIMITED, Plymouth (GB)

(72) Inventors: Andrea Pinos, Plymouth (GB); Samir Mezouari, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 444 days.

(21) Appl. No.: 17/413,873

(22) PCT Filed: Dec. 12, 2019

(86) PCT No.: PCT/EP2019/084933
§ 371 (c)(1),
(2) Date: Jun. 14, 2021

(87) PCT Pub. No.: WO2020/120692
PCT Pub. Date: Jun. 18, 2020

(65) Prior Publication Data
US 2022/0059726 A1   Feb. 24, 2022

(30) Foreign Application Priority Data
Dec. 14, 2018   (GB) ...................................... 1820449

(51) Int. Cl.
*H01L 33/32*   (2010.01)
*H01L 27/15*   (2006.01)
(Continued)

(52) U.S. Cl.
CPC ............ *H01L 33/32* (2013.01); *H01L 27/156* (2013.01); *H01L 33/0075* (2013.01); *H01L 33/62* (2013.01); *H01L 2933/0066* (2013.01)

(58) Field of Classification Search
CPC ... H01L 33/32; H01L 27/156; H01L 33/0075; H01L 33/62; H01L 2933/0066; H01L 33/54; H01L 25/167; H01L 33/08
See application file for complete search history.

(56) References Cited

U.S. PATENT DOCUMENTS

2003/0107047 A1   6/2003   Okuyama et al.
2013/0207101 A1   8/2013   Yamazaki et al.
(Continued)

FOREIGN PATENT DOCUMENTS

| CN | 108962931 A | 12/2018 |
|---|---|---|
| WO | 2017123999 A1 | 7/2017 |

OTHER PUBLICATIONS

Liu Chao et al., "Metal-interconnection-free integration of InGaN/GaN light emitting diodes with AlGaN/GaN high electron mobility transistors," Applied Physics Letters, 2015, vol. 106, No. 18, p. 181110-1-181110-4.
(Continued)

*Primary Examiner* — Yasser A Abdelaziez
(74) *Attorney, Agent, or Firm* — Stinson LLP

(57) ABSTRACT

An active matrix LED array precursor forming a precursor to a micro LED array is provided. The active matrix LED array precursor comprises a common first semiconducting layer comprising a substantially undoped Group III-nitride, a plurality of transistor-driven LED precursors, and a common source contact. Each transistor-driven LED precursor comprises a monolithic light emitting diode (LED) structure comprising a plurality of III-nitride semiconducting layers, a barrier semiconducting layer, and a gate contact. Each monolithic LED structure is formed on a portion of the common semiconducting layer. The barrier semiconducting is layer formed on a portion of the common semiconducting layer encircling the LED structure and configured to induce a two-dimensional electron channel layer at the interface
(Continued)

between the common semiconducting layer and the barrier semiconducting layer. The gate contact is formed over a portion of the two-dimensional electron channel layer, the gate contact encircling the LED structure. The common source contact is configured to form an ohmic contact to each portion of the two-dimensional electron channel layer such that a high electron mobility transistor is provided between the common source contact and each monolithic LED structure for driving each LED structure.

24 Claims, 5 Drawing Sheets

(51) Int. Cl.
*H01L 33/00* (2010.01)
*H01L 33/62* (2010.01)

(56) References Cited

U.S. PATENT DOCUMENTS

| | | |
|---|---|---|
| 2013/0240832 A1 | 9/2013 | Hersee |
| 2014/0166974 A1 | 6/2014 | Yoo et al. |
| 2015/0255582 A1 | 9/2015 | Romano et al. |
| 2016/0190384 A1 | 6/2016 | Huang et al. |
| 2017/0194476 A1 | 7/2017 | Brueck et al. |
| 2017/0251533 A1 | 8/2017 | Shut et al. |
| 2017/0345920 A1* | 11/2017 | Nagahisa .......... H01L 29/41758 |
| 2018/0030876 A1 | 5/2018 | Hsu et al. |
| 2019/0006564 A1* | 1/2019 | Sasaki .................... H01L 33/62 |
| 2021/0005742 A1* | 1/2021 | Ujita .................... H01L 29/205 |

OTHER PUBLICATIONS

International Search Report, PCT/EP2019/084933, dated Mar. 18, 2020, 3 pages.

\* cited by examiner

ACTIVE MATRIX LED ARRAY

REFERENCE TO RELATED APPLICATIONS

This application is a U.S. national stage application of International Patent Application No. PCT/EP2019/084933, filed Dec. 12, 2019, which claims the benefit of Great Britain Patent Application No. 1820449.5, filed Dec. 14, 2018, the entire disclosures of which are incorporated herein by reference.

FIELD OF THE DISCLOSURE

The present disclosure relates to Group III-nitride semiconductors. In particular, the present disclosure relates to Light Emitting Diodes (LEDs) and supporting driving electronics comprising III-nitride semiconductors.

BACKGROUND

Micro LED arrays are commonly defined as arrays of LEDs with a size of 100×100 µm² or less. Micro LED arrays are a self-emitting micro-display/projector which are suitable for use in a variety of devices such as smartwatches, head-wearing displays, head-up displays, camcorders, viewfinders, multisite excitation sources, and pico-projectors.

One known form of a micro-LED array comprises a plurality of LEDs formed from Group III-nitrides. Group III-nitride LEDs are inorganic semiconductor LEDs containing GaN and its alloys with InN and AlN in the active light-emitting region. Group III-nitride LEDs can be driven at significantly higher current density and emit a higher optical power density than conventional large-area LEDs, for example organic light emitting diodes (OLED) in which the light-emitting layer is an organic compound. As a result, higher luminance (brightness), defined as the amount of light emitted per unit area of the light source in a given direction, makes micro LEDs suitable for applications requiring or benefiting from, high brightness. For example, applications which benefit from high brightness may include displays in high brightness environments or projectors. Additionally, III-nitride micro LEDs are known to have relatively high luminous efficacy, expressed in lumens per watt (lm/W) compared to other conventional large area LEDs. The relatively high luminous efficacy of III-nitride micro LED arrays reduces power usage compared with other light sources and makes micro LEDs particularly suitable for portable devices.

Furthermore, owing to the intrinsic material properties of III-nitrides, micro LED arrays can be operated at extreme conditions such as high or low temperatures and humidity thereby providing a performance and reliability advantage in wearable and outdoor applications.

Two main approaches currently exist for the production of inorganic micro LED arrays. In the first approach, individual micro LED devices are produced with techniques similar as for standard LEDs. The individual micro LEDs are then assembled as a matrix by a pick and place technique onto a substrate. The substrate typically includes an active matrix backplane comprising the driving circuitry for individual micro LED addressing.

This first approach allows LEDs with different properties to be chosen and placed on the substrate as desired. For example LEDs with different emission wavelengths that have been fabricated on different growth substrates may be arranged in array for the purpose of achieving full colour displays. Additionally, pick and place techniques allow for the discarding of faulty devices before they become part of an array thereby improving the final yield of the array. On the other hand, the resolution (small pitch) and array size (large number of micro LEDs) that are required in a variety applications pose severe challenges to this approach in terms of pick and place accuracy and transfer time, affecting the reliability of the process and its throughput, respectively.

The second approach uses monolithic integration to fabricate the micro LED forming the array from the same growth substrate, thus allowing a higher integration density, smaller LEDs and smaller pitch (i.e. higher array resolution). This second approach relies on colourisation techniques to achieve full colour displays. The colourisation technology used for micro LEDs depends on the micro LED array pitch where established phosphor materials for lighting applications are so far only suitable for large pitch and low resolution arrays. Higher resolution applications require different approaches to wavelength conversion such as quantum dots.

A less commonly employed manufacturing process uses selective area growth (SAG) to achieve an electrically isolated portion of active region that can be independently injected with a current without using an etching step as disclosed in U.S. Pat. No. 7,087,932. In the selective area growth technique, a mask is patterned on a buffer layer. The material in the mask is such that the at the growth conditions, no additional material is grown directly on the mask but only inside apertures exposing portions of the surface of the underlying buffer layer. Another noteworthy feature of selective area growth of III-nitrides grown along the [0001] direction is that depending on the growth parameters such as growth temperature, pressure, and V/III ratio, inclined facets with respect to the (0001) plane also known as c-plane are obtained around the perimeter of the growing portions of c-plane semiconductor as defined by the open areas of the patterned mask. The inclined facets are generally oriented along the {1-101} or {1-102} planes of the wurtzite crystal and present reduced polarisation fields compared with c-plane surfaces (semipolar surfaces).

In addition to the technology used for producing each micro LED to be used in an array, an electronic structure must also be provided for driving the plurality of micro LEDs. Typically, each micro LED is integrated into an active matrix structure in order to drive the micro LEDs. Common types of high-resolution colour display panels, such as modern computer displays, smart phones and televisions typically use an active matrix display panel structure for better image quality whereby each pixel in an active matrix display panel is driven by active driving circuitry.

Active matrix array structures for driving LCD displays are well known in the art. Such known LCD systems typically comprise a common backplane light source and an array of liquid crystal pixels connected together in an active matrix structure.

One example of an active matrix array structure for a single pixel of an LCD display is shown in FIG. 1. The circuit includes a data line connected to all pixels in a column while the scan line is connected to all the pixels in a row. The active matrix display is arranged to provide a variable voltage to the liquid crystal (represented as capacitor $C_{LC}$ in FIG. 1).

Voltage resets the metastable orientation of liquid crystals which then allow more or less of the light coming from the backplane light source through crossed polarisers to the viewer. Data lines feed pixels along each column while scan lines feed pixels along each row. A pixel along a column receives its brightness information from the data line through a switching thin-film transistor (Sw-TFTs) whose gate is addressed by the scan line for that pixel row. The Sw-TFTs are for the most part kept in their off state except for a brief pulse, once per display refresh cycle, during which time the data line voltage is passed to the pixel, updating its brightness information. The Sw-TFTs used in this application need not pass high currents, therefore relatively low mobility amorphous Si (a-Si) is often used in the transistor channel. In addition to the Sw-TFT a storage capacitor ($C_S$) in parallel to the liquid crystal is typically included within each pixel to sustain the voltage written to the liquid crystal throughout the refresh cycle. As such, the circuitry of the active matrix for each pixel comprises a single transistor (Sw-TFT) and a single capacitor ($C_S$). This structure is known as a 1T+1C circuit. By sequentially addressing the scan lines while simultaneously updating the data line voltages, a scene frame is set over the entire 2D array.

For micro-LED arrays, the brightness of each LED is determined by the current flowing through each LED. In order to control the current flow through each LED in a micro LED array, each LED is individually driven by its own specific driving transistor.

An example of an active matrix array structure for a single pixel of a micro Led array is shown in FIG. 2. The energising current for each micro LED is sourced from a connection between a common source and power line ($V_{DD}$) common to each pixel. The drive transistor (D-T) controls the current level though the micro LED by the voltage applied to the drive transistor's gate. The gate voltage to the drive transistor's gate can be controlled by a further transistor and capacitor. The drive transistor's gate voltage comes from the data line, through a switching transistor Sw-TFT, whenever the corresponding scan line is addressed (with the storage capacitor wired in parallel to the D-TFT's gate, sustaining its voltage throughout the refresh cycle). As such, the active matrix array structure for each pixel comprises two transistors and a single capacitor, a 2T+1C structure.

In the 2T+1C structure, the requirements imposed on the semiconducting channel materials of the Sw-TFT and the D-TFT are quite different. The Sw-TFT is normally off; it is only switched on for microseconds once per display refresh cycle, and must source little current in its on-state. Accordingly, a-Si is typically used for the channel of the Sw-TFTs in a similar manner to the 1T+1C structure known for liquid crystal displays. The D-TFT in contrast must source a high current when a pixel needs to be brightly lit and it can be called upon to do so for long periods of time. This constitutes a serious technical challenge considering the low mobility of the materials commonly used in the TFT technology.

One known example of a 2T+1C LED structure is disclosed in US 2017/0179192 in which an array of LEDs are integrated with corresponding TFT driver circuitry. In one embodiment, a driving transistor for each LED is fabricated as a thin film transistor directly on to the same substrate as the LED. Amorphous silicon is used to fabricate the thin film driving transistor on the substrate of the LED array. Alternatively, flip-chip bonding is used to connect a further substrate comprising switching transistors and capacitors to LEDs in order to provide a 2T+1C structure.

An alternative structure for integrating a III-nitride LED and a driving transistor is disclosed in "Metal-interconnection-free integration of InGaN/GaN light emitting diodes with AlGaN/GaN high electron mobility transistors" by Chao Liu et al, Applied Physics Letters 106, 181110 (2015); doi: 10.1063/1.4921049. A metal-interconnection-free integration scheme for InGaN/GaN light emitting diodes (LEDs) and AlGaN/GaN high electron mobility transistors (HEMTs) is provided by combining selective epi removal and selective epitaxial growth techniques. Firstly, selective epi removal of a HEMT epi layer was carried out to expose a bottom unintentionally doped GaN buffer and a sidewall GaN channel. A LED structure was regrown in the selective epi removal region with the bottom n-type GaN layer (n-electrode of the LED) connected to the HEMT laterally, enabling monolithic integration of the HEMT and LED (HEMT-LED) without metal-interconnection.

However, there remains a need to improve the integration of micro LEDs and the active matrix electronic circuitry for driving the micro LEDs in an array.

It is an object of the present invention to provide an improved LED array precursor which tackles at least one of the problems associated with prior art arrays or, at least, provide a commercially useful alternative thereto.

SUMMARY OF THE DISCLOSURE

The present inventors have realised that is desirable to increase the integration of the active matrix circuitry with the substrate on which the LED array is formed.

According to a first aspect of this disclosure, an active matrix LED array precursor is provided. The active matrix LED array precursor comprises a common first semiconducting layer comprising a substantially undoped Group III-nitride, a plurality of transistor-driven LED precursors, and a common source contact. Each transistor-driven LED precursor comprises a monolithic light emitting diode (LED) structure comprising a plurality of III-nitride semiconducting layers, a barrier semiconducting layer, and a gate contact. Each monolithic LED structure is formed on a portion of the common semiconducting layer. The barrier semiconducting layer is formed on a portion of the common semiconducting layer encircling the monolithic LED structure and is configured to induce a two-dimensional electron channel layer at the interface between the common semiconducting layer and the barrier semiconducting layer. The gate contact is formed over a portion of the two-dimensional electron channel, wherein the gate contact encircles the LED structure. The common source contact is configured to form an ohmic contact to each two-dimensional electron channel such that a high electron mobility transistor is provided between the common source contact and each monolithic LED structure for driving each LED structure. It will be appreciated that the first aspect of this disclosure is concerned with a precursor to an active matrix LED array. By the term "precursor" in active matrix LED array precursor, it is noted that the active matrix LED array precursor described does not necessarily include the electrical contacts for each LED such as to allow the emission of light, nor the associated circuitry. Of course, the active matrix LED array precursor of the first aspect does not preclude the addition of further electrical contacts and associated circuitry. As such use of the term precursor in this disclosure is intended to include the finalised product (i.e. an active matrix LED array).

By the term LED array in the active matrix LED array precursor of this disclosure it is intended to refer to a plurality of LEDs that are intentionally spaced across a structure. Typically said LEDs form a regular array, such as hexagonally close-packed array or a square packed array of LEDs.

Thus, the active matrix LED array precursor according to the first aspect provides a plurality of transistor-driven LED precursors arranged in an array. The plurality of transistor-driven LED precursors each include an integrated high electron mobility transistor (HEMT) configured to provide the driving current for each of the monolithic LED structures. The barrier layer which encircles each monolithic LED structure is configured to induce a two dimensional electron channel layer in the first semiconducting layer such that the channel of the HEMT is provided between the common source contact and the monolithic LED structure. Said two dimensional electron channel layer can be modulated by an electric field applied to the gate contact in order to enhance or deplete the channel. As such, it is understood that the HEMT may be a normally-on HEMT or a normally-off HEMT.

Advantageously, HEMTs have a relatively high channel mobility compared to a-Si TFTs. Thus, the performance of the driving circuitry for the active matrix LED array may be improved. Furthermore, the HEMT structure is integrated into the common first semiconductor layer of the active matrix LED array precursor on which the monolithic LED structures are provided. As such, at least part of the active matrix 2T+1C electronic circuitry for driving the LED array may be more efficiently fabricated.

According to the first aspect, the first semiconductor layer and, indeed, the further semiconductor layers, comprise Group III-nitrides. Preferably the Group III-nitrides comprise one of more of AlInGaN, AlGaN, InGaN and GaN. According to the first aspect, the common first semiconductor layer is a substantially undoped Group III-nitride. By substantially undoped, it is understood that the Group III-nitride does not include any significant quantity of a dopant elements, whilst appreciating that some impurities may be present as a result of the fabrication process. As such, the substantially undoped Group III-nitride may be not intentionally doped (i.e. an unintentionally doped Group III-nitride).

As used herein, any reference to a species by its constituent components includes all available stoichiometries thereof. Thus, for example, AlGaN includes all alloys thereof, such as $Al_xGa_{1-x}N$ wherein x does not equal 1 or 0. Preferred stoichiometries will vary depending on the function of the specific layer.

According to the first aspect, the gate contact for each transistor-driven LED precursor encircles each monolithic LED structure so that the current to each monolithic LED structure can be modulated independently of the other monolithic LED structures in the array. In one preferred embodiment, the gate contact is effectively an annular gate contact which encircles the LED structure.

The common source contact of the first aspect provides a source of electrons for the driving current to each transistor-driven LED precursor. The common source contact can be provided by a variety of different means.

For example, the common source contact may comprise a plurality of source vias, each source via configured to extend through the barrier semiconducting layer to the common first semiconductor layer.

Preferably, the monolithic LED structures according to the disclosure are provided to form at least part of a micro LED array. As such, in some embodiments of this disclosure, the active matrix LED array precursor may be an active matrix micro LED array precursor. Accordingly, the first aspect of this disclosure may provide a precursor to an active matrix micro LED array.

In some embodiments, each source via may comprise a metallic source contact, each metallic source contact configured to make an Ohmic contact to the two-dimensional electron channel layer of each transistor-driven LED precursor. For example, each metallic source contact may be formed from a stack of metallic layers. Preferably, the stack of metallic layers includes Ti, Al, Ni, and/or Au.

In some embodiments, each source via may be formed from a similar Group III-nitride semiconductor as the monolithic LED precursor. For example, the monolithic LED structure may comprise a second semiconductor layer extending from the first semiconducting layer in a column. Each source via may also be a monolithic structure (i.e. a monolithic source structure) comprising the second semiconductor layer extending from the first semiconducting layer in a column. As such, the monolithic source via may be formed by a similar process as the process for forming the second semiconductor layer of the monolithic LED structure. Accordingly, the number of different fabrication processes used to fabricate the plurality of transistor-driven LED precursors may be reduced. Furthermore, by forming the source contact from a Group III-nitride semiconductor, the electrical contact to the two-dimensional electron channel layer of the first common semiconductor layer, which is also a Group III-nitride, may be improved.

In some embodiments, the common source contact encircles each of the monolithic LED structures and the gate contacts. As such, the common source contact may extend over the barrier layer such that it encircles each of the monolithic LED structures and the gate contacts. Accordingly, the source current for each transistor-driven LED precursor may be distributed across the active matrix LED array.

Preferably, each transistor-driven LED precursor further comprises a capacitor formed between a portion of the common source contact and a portion of each gate contact. As such, each transistor-driven LED precursor comprises a capacitor connected between the gate and source contacts of a HEMT for driving the LED. Accordingly, the driving transistor and the capacitor of the 2T+1C active matrix circuitry may be integrated with the LED array. Increased integration of the active matrix circuitry and the LED array may provide advantages associated with a reduction in processing complexity, space efficiency, and electrical performance.

Preferably, the portions of the gate contact layer and the common source contact layer forming each capacitor overlap, separated by a dielectric layer. As such, the capacitor for each transistor-driven LED precursor may be fabricated as a thin film capacitor.

Preferably, each transistor driven LED precursor further comprises an insulating mask layer provided between each gate contact and the barrier semiconducting layer. The insulating mask layer may be used to define regions for forming the monolithic LED structures.

Furthermore, the insulating mask layer may provide a suitable layer for the formation of further electronic circuitry. For example, the insulating mask layer may provide a surface on which the gate contacts, common source contact and/or gate-source capacitor may be formed on.

Preferably the barrier layer of each transistor-driven LED precursor is provided as a common barrier layer. As such, it is understood that the common barrier layer may be provided on the first semiconducting layer as a substantially continuous layer. Consequently, the two-dimensional electron channel layer may extend substantially across the active matrix LED precursor in order to interconnect the sources of each transistor driven LED precursor. In some embodiments, it will be appreciated that the barrier layer for each transistor-driven LED precursor may be discontinuous with at least some of the other barrier layers of other transistor-driven LED precursors. For example, selective removal of portions of a common barrier layer may result in the barrier layer for at least one transistor-driven LED precursor being discontinuous with other transistor-driven LED precursors in the active matrix LED array precursor.

In some embodiments, the barrier layer may comprise a plurality of sublayers formed from Group III-nitrides. In one preferred embodiment, the barrier layer comprises a first sub layer and a second sub layer. The second sub layer may be provided between the first sub layer and the first common semiconductor layer. As such, the second sub-layer may be a spacer layer. The first and second sub-layers may be formed from Group III-nitrides. The compositions of the first and second sub-layers may be configured to optimise the resistivity of the two-dimensional electron channel layer of the HEMT. For example, in one embodiment, the first sub layer may be formed from n-doped $Al_xGa_{1-x}N$, or more preferably substantially undoped $Al_xGa_{1-x}N$ and the second sub layer formed from substantially undoped $Al_xGa_{1-x}N$, or more preferably substantially undoped AlN.

In some embodiments, the transistor-driven LED precursor may be configured as a normally-on transistor driven LED precursor. As such, it will be understood that the HEMT of the transistor driven-LED precursor is a normally-on HEMT. The normally-on HEMT may be configured such that a region of the two-dimensional electron channel layer proximal to each gate contact has an increased mobile charge carrier density under no applied bias.

In some embodiments, the transistor-driven LED precursor may be configured as a normally-off transistor driven LED precursor. As such, it will be understood that the HEMT of the transistor driven-LED precursor is a normally-off HEMT. The normally off HEMT may be configured such that a region of the two-dimensional electron channel layer proximal to each gate contact has a reduced mobile charge carrier density under no applied bias.

According to the first aspect, each transistor-driven LED precursor comprises a monolithic LED structure. By monolithic LED structure, it is envisaged that each LED structure is monolithically formed on the first semiconductor layer. Each monolithic LED structure may be a precursor to a complete, operational LED, or it may include all electrical contacts sufficient to emit light in response to an electrical current. Preferably, each monolithic LED structure includes at least a second semiconductor layer on the common first semiconductor layer, having an upper surface portion parallel to the plane of the LED array precursor, the second semiconductor layer having a regular trapezoidal cross-section normal to the upper surface portion, such that the second semiconductor layer has sloped sides. The second semiconductor layer may comprise a Group III-nitride.

Preferably, each monolithic LED structure may also comprise a third semiconductor layer on the second semiconductor layer, having an upper surface portion parallel to the plane of the LED array precursor, the third semiconductor layer formed on the second semiconductor layer such that the second and third semiconductor layers have a regular trapezoidal cross-section normal to the upper surface portion, such that the third semiconductor layer has sloped sides parallel to the sloped sides of the second semiconductor layer.

Preferably, each monolithic LED structure may also comprise a fourth semiconductor layer on the third semiconductor layer, having an upper surface portion parallel to the plane of the LED array precursor, the fourth semiconductor layer formed on the third semiconductor layer such that the second, third, and fourth semiconductor layers have a regular trapezoidal cross-section normal to the upper surface portion, such that the fourth semiconductor layer has sloped sides parallel to the sloped sides of the third semiconductor layer.

Preferably, each monolithic LED structure may also comprise a primary electrical contact on the fourth semiconductor layer, wherein the contact is only on the upper surface portion of the fourth semiconductor layer which is parallel to the plane of the LED array precursor.

Preferably, the first to fourth semiconductor layers comprise Group III-nitrides, and the third semiconductor layer comprises a plurality of quantum well sub-layers, the quantum well sub-layers having a greater thickness on a portion parallel to the plane of the LED array precursor and a reduced thickness on a portion which is not parallel to the plane of the LED array precursor.

According to a second aspect of the disclosure, a planarised active matrix LED array precursor is provided. The planarised active matrix LED array precursor comprises an active matrix LED array precursor according to the first aspect of this disclosure and a gap-filling insulator layer provided over a surface of the common semiconductor layer on which the plurality of transistor-driven LED precursors are provided. The gap-filling insulator is configured to define a substantially planarised surface for the fabrication of electronic devices thereon.

The planarised surface of the planarised active matrix LED array precursor provides a surface on which further electronic devices may be fabricated. For example thin film electronic devices forming part of the 2T+1C active matrix circuitry such as a thin film transistor and/or thin film capacitor may be formed on the planarised surface. Accordingly, the 2T+1C circuitry can be formed on the same substrate as the LED array by thin film fabrication techniques, thereby increasing the integration of the active matrix circuitry with the LED array.

Preferably, a plurality of thin film transistors are formed on the substantially planarised surface of the gap filling insulator, each thin film transistor in electrical contact with a gate contact of a transistor-driven LED precursor, the plurality of thin film transistors forming part of an active matrix circuit. The planarised surface of the planarised active matrix LED array precursor is configured such that the thin film transistors may be formed from conventional thin film materials such as a-Si and/or inorganic metal oxide alloys (InGaZnO, AlZnO, GaZnO etc.).

According to a third aspect of the disclosure a method of forming an active matrix LED array precursor is provided. The method comprises:
    (i) providing a substrate having a surface;
    (ii) forming a continuous first semiconductor layer on the surface of the substrate, the first semiconducting layer comprising a substantially undoped Group III-nitride,
    (iii) forming a barrier layer on the first semiconductor layer, the barrier layer configured to induce a two-dimensional electron channel layer at the interface between the first semiconductor layer and the barrier layer;
    (iv) selectively masking the barrier layer by depositing a masking layer comprising a plurality of LED-defining apertures;
    (v) selectively removing unmasked portions of the barrier layer and the first semiconductor layer to expose a portion of the first semiconductor layer through each of the LED-defining apertures;

(vi) forming a monolithic LED structure comprising a plurality of Group III-nitride semiconducting layers on unmasked portions of the first semiconductor layer through the LED-defining apertures such that each monolithic LED structure is encircled by the two-dimensional electron channel layer;

(vii) forming a plurality of gate contacts, the gate contacts formed over portions of the two-dimensional electron channel layer, each gate contact encircling a monolithic LED structure; and (viii) forming a common source contact, the common source contact configured to provide an ohmic contact to each portion of the two-dimensional electron channel layer such that a plurality of transistor-driven LED precursors are formed comprising high electron mobility transistors between the common source contact and each monolithic LED structure.

As such, the method according to the third aspect of the disclosure may provide an active matrix LED precursor according to the first aspect of the disclosure. Accordingly, the preferable features and any associated advantages of the first aspect apply equally to the corresponding method features of the third aspect. The method involves a number of numbered steps. It will be appreciated that where possible these steps may be performed simultaneously or concurrently.

Preferably the method further comprises forming a plurality of capacitors, each capacitor formed between a portion of the common source contact and a portion of each gate contact.

Preferably, the portions of the gate contacts and the portions of the common source contact forming each capacitor are formed so that they overlap. As such, the gate contacts and the portions of the common source contact forming each capacitor overlap with respect to the first semiconductor layer over which both gate contacts and common source contact are formed. In an alternative embodiment, the gate contacts and the portions of the common source contact forming each capacitor may be provided in a side by side configuration.

Preferably, the step of forming a plurality of capacitors further comprises forming a dielectric layer separating the portions of the common source contact and the portions of each gate contact.

Preferably, forming the common source contact comprises forming the common source contact such that the common source contact encircles each of the monolithic LED structures and the gate contacts.

Preferably, the barrier layer comprises a plurality of sublayers formed from Group III-nitrides. In one preferred embodiment, the barrier layer comprises a first sub layer and a second sub layer. The second sub layer may be provided between the first sub layer and the first common semiconductor layer. As such, the second sub-layer may be a spacer layer. The first and second sub-layers may be formed from Group III-nitrides. The compositions of the first and second sub-layers may be configured to optimise the resistivity of the two-dimensional electron channel layer of the HEMT. For example, in one embodiment, the first sub layer may be formed from substantially undoped $Al_xGa_{1-x}N$ and the second sub layer formed from substantially undoped $Al_xGa_{1-x}N$, or more preferably substantially undoped AlN.

Preferably, forming a monolithic LED structure comprising a plurality of Group III-nitride semiconducting layers on unmasked portions of the first semiconductor layer through the LED-defining apertures further comprises growing a second semiconductor layer comprising a Group III-nitride on unmasked portions of the first semiconductor layer through the LED-defining apertures to form a plurality of columns for a monolithic LED structure encircled by the two-dimensional electron channel layer.

Preferably, forming the common source contact comprises forming a plurality of source vias, each source via configured to extend through the barrier semiconducting layer to the common first semiconductor layer.

Preferably, forming the plurality of source vias comprises selectively masking the barrier layer by depositing a masking layer further comprising a plurality of source-defining apertures, selectively removing unmasked portions of the barrier layer and the first semiconductor layer to expose a portion of the first semiconductor layer through each of the source-defining apertures, and growing a second semiconductor layer on unmasked portions of the first semiconductor layer through the source-defining apertures of the masking layer to form a plurality of columns extending through the masking layer configured to provide a source contact to each portion of the two-dimensional electron channel layer.

Preferably, the monolithic LED structure comprises a second semiconductor layer on the common first semiconductor layer, having an upper surface portion parallel to the plane of the LED array precursor, the second semiconductor layer having a regular trapezoidal cross-section normal to the upper surface portion, such that the second semiconductor layer has sloped sides.

Preferably, the monolithic LED structure comprises a third semiconductor layer on the second semiconductor layer, having an upper surface portion parallel to the plane of the LED array precursor, the third semiconductor layer formed on the second semiconductor layer such that the second and third semiconductor layers have a regular trapezoidal cross-section normal to the upper surface portion, such that the third semiconductor layer has sloped sides parallel to the sloped sides of the second semiconductor layer.

Preferably, the monolithic LED structure comprises a fourth semiconductor layer on the third semiconductor layer, having an upper surface portion parallel to the plane of the LED array precursor, the fourth semiconductor layer formed on the third semiconductor layer such that the second, third, and fourth semiconductor layers have a regular trapezoidal cross-section normal to the upper surface portion, such that the fourth semiconductor layer has sloped sides parallel to the sloped sides of the third semiconductor layer.

Preferably, the monolithic LED structure comprises a primary electrical contact on the fourth semiconductor layer, wherein the contact is only on the upper surface portion of the fourth semiconductor layer which is parallel to the plane of the LED array precursor.

The first to fourth semiconductor layers comprise Group III-nitrides. The third semiconductor layer may comprise a plurality of quantum well sub-layers, the quantum well sub-layers having a greater thickness on a portion parallel to the plane of the LED array precursor and a reduced thickness on a portion which is not parallel to the plane of the LED array precursor.

According to a fourth aspect of the disclosure a method of forming a planarised active matrix LED array precursor is provided. The method comprises forming an active matrix LED array precursor according to the third aspect of the disclosure, and forming a gap-filling insulator layer over a surface of the first semiconducting layer on which the plurality of transistor-driven LED precursors are provided.

The gap-filling insulator is configured to define a substantially planarised surface for the fabrication of electronic devices thereon.

As such, the method according to the fourth aspect of the disclosure may provide a planarised active matrix LED precursor according to the second aspect of the disclosure. Accordingly, the preferable features and any associated advantages of the second aspect apply equally to the corresponding method features of the fourth aspect.

Preferably, the method further comprises forming a plurality of thin film transistors on the substantially planarised surface of the gap filling insulator. Each thin film transistor may be in electrical contact with a gate contact of the transistor-driven LED precursor, the plurality of thin film transistors forming part of an active matrix circuit.

BRIEF DESCRIPTION OF FIGURES

The invention will now be described in relation to the following non-limiting figures. Further advantages of the disclosure are apparent by reference to the detailed description when considered in conjunction with the figures, which are not to scale so as to more clearly show the details, wherein like reference numbers indicate like elements throughout the several views, and wherein.

DETAILED DESCRIPTION

The present invention will now be further described. In the following passages different aspects of the invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous As used herein, any reference to a species by its constituent components includes all available stoichiometries thereof. Thus, for example, AlGaN includes all alloys thereof, such as $Al_xGa_{1-x}N$ wherein x does not equal 1 or 0. Preferred stoichiometries will vary depending on the function of the specific layer.

Embodiments of this disclosure describe transistor-driven LEDs and methods of forming transistor-driven LEDs with various structural configurations to integrate a driving transistor array and micro LED array for the purpose of simplifying and reducing the cost of an active matrix backplane in a micro LED display. As such, embodiments of this disclosure preferably relate to active matrix micro LED arrays and/or active matrix micro LED array precursors. Micro LED arrays are commonly defined as arrays of LEDs with a size of 100×100 μm² or less. Embodiments may further include connections to a matrix of thin film switching transistors and capacitors for the purpose of obtaining a functioning 2T+1C active matrix display.

Figure 1:
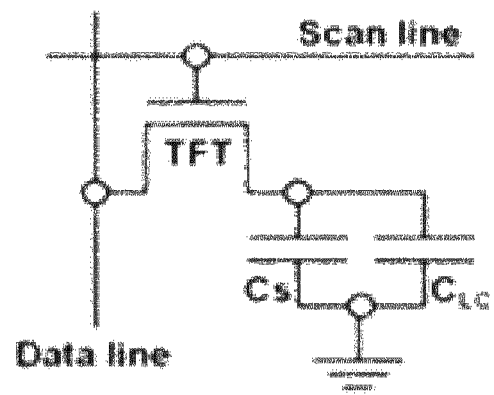
FIG. 1 shows a circuit diagram of a 1T+1C active matrix circuit for a liquid crystal display pixel.
Figure 2:
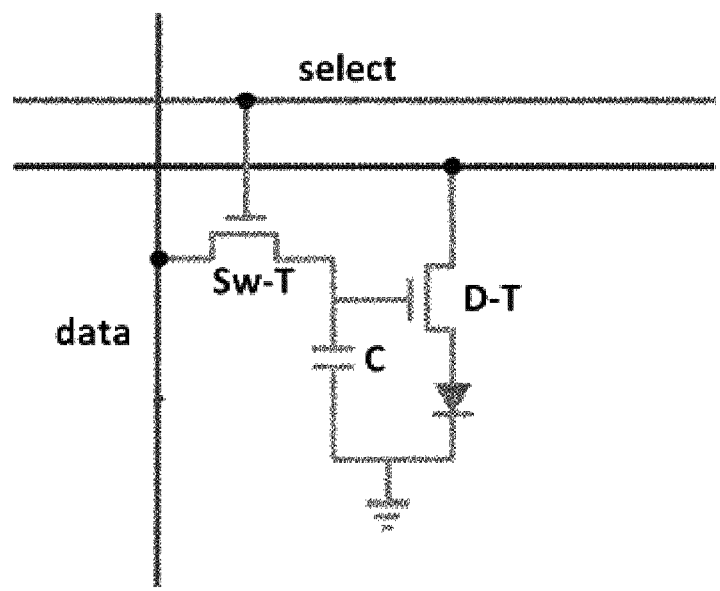
FIG. 2 shows a circuit diagram of a 2T+1C active matrix circuit for a micro LED.
Figure 3:
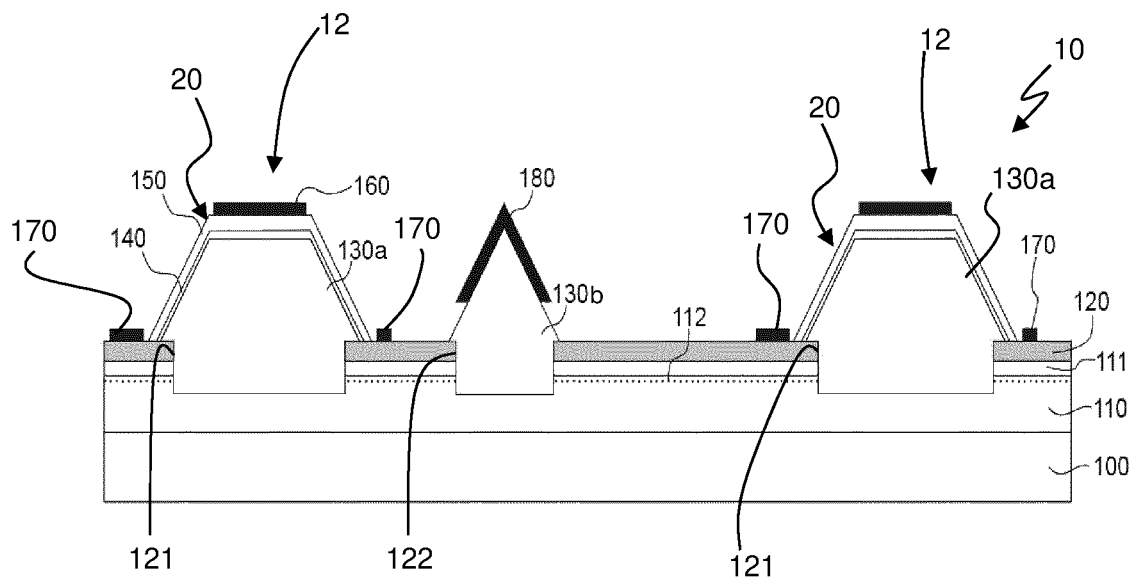
FIG. 3 shows a cross section of an active matrix LED array precursor according to an embodiment of the disclosure.
Figure 4:
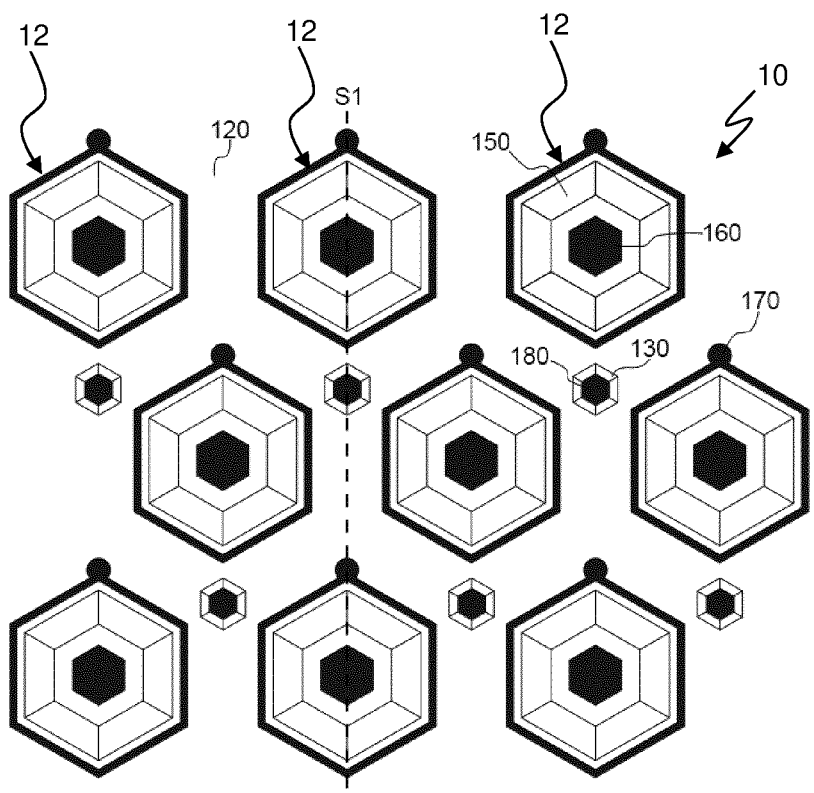
FIG. 4 shows a plan view of a portion of the active matrix LED array precursor according to an embodiment of the disclosure.

According to an embodiment of this disclosure an active matrix LED array precursor 10 is provided. FIG. 3 shows a cross-sectional side-view of a section of the active matrix LED array precursor 10 while FIG. 4 provides a plan view of a portion of the active matrix LED array precursor 10. The cross section of FIG. 3 is indicated by line S1 in FIG. 4. The active matrix LED array precursor 10 comprises a plurality of transistor-driven LED precursors 12 which are suitable for implementing the driving transistor and LED of the 2T+1C active matrix circuit shown in FIG. 5.

The active matrix LED array precursor 10 shown in FIG. 3 includes a growth substrate 100. The growth substrate 100 may be a Si, Sapphire or SiC wafer, or any other suitable substrate for the fabrication of thin film electronics.

A first semiconductor layer 110 is formed on the growth substrate 100. The first semiconductor layer 110 is formed across a substantial portion of the growth substrate such that it is common to each of the transistor-driven LED precursor 12. The first semiconductor layer 110 is a substantially undoped Group III-nitride semiconductor. Preferably, the first semiconductor layer 110 is substantially undoped GaN. In a particularly preferred embodiment, the first semiconductor layer 110 is substantially undoped GaN having a c-plane orientation. Preferably the first semiconductor layer has a thickness of at least 100 nm. Preferably the first semiconductor has a thickness of no greater than 5000 nm, or more preferably no greater than 2500 nm.

A barrier semiconductor layer 111 is provided on the first semiconductor layer 110. The barrier semiconductor layer may be formed from a Group III-nitride semiconductor having a wider bandgap than the first semiconductor layer 110. In the embodiment of FIG. 3, the barrier layer 111 is formed on the first semiconductor layer 110 as a continuous layer. As such, the barrier layer 111 for each transistor-driven LED precursor 12 may be a common barrier layer. As shown in FIG. 3, the barrier layer 111 may be formed as a continuous layer between each transistor-driven LED precursor 12. In some embodiments, the barrier layer may be $Al_xIn_yGa_{1-x-y}N$, where $0<x\leq1$ and $0\leq y<1$. In one embodiment the barrier layer may be substantially undoped $Al_xGa_{1-x}N$ where $0.15\leq x\leq1$ (i.e. y=0). The barrier layer may have a thickness of at least 5 nm. The barrier layer may have a thickness of no greater than 40 nm. For example, a barrier may be substantially undoped $Al_xGa_{1-x}N$ where x=0.25 and the barrier layer has a thickness of 20 nm.

The barrier layer is chosen with an electronic structure such that a two-dimensional electron channel layer 112 (an electron channel layer 112) forms at the interface between the first semiconductor layer 110 and the barrier layer 111. By two dimensional electron channel layer, the skilled person understands that an effective electron gas is formed in the first semiconductor layer 110 which is constrained in a relatively thin layer (i.e. less than 5 nm thickness) at the heterojunction interface between the first semiconductor layer and the barrier layer 111.

The barrier semiconducting layer may be formed from a Group III-nitride having a wider electronic bandgap than the first semiconducting layer 110. The barrier layer 111 may also be doped in order to adjust the electronic characteristics of the two-dimensional electron channel 112. Group III-nitride heterojunctions are well known in the art, and so the skilled person is aware of the design of a barrier layer 111 comprising Group-III nitride semiconductors configured to induce a two-dimensional electron channel in the first semiconductor layer 110.

As shown in FIG. 3, a mask layer 120 is provided over the barrier layer 111. In the embodiment of FIG. 3 the mask layer 120 is in contact with the barrier layer 111. Of course, in other embodiments other layers may be present between these layers. Portions of the barrier semiconductor layer 111 and the mask layer 120 are selectively removed such that portions of the first semiconductor layer 110 are accessible through openings 121, 122 formed through the barrier layer 111 and the mask layer 120. The mask layer 120 may comprise a $SiO_2$ layer or a $SiN_x$ layer that is deposited ex-situ or in-situ in the reactor chamber following the deposition of the barrier layer 111.

In a preferred embodiment of the present invention, a $SiN_x$ mask layer 120 may be deposited in-situ on the semiconductor layer 110 and the barrier layer 111 with a thickness between 1 nm and 100 nm and preferably between 1 nm and 10 nm as to obtain a thin conformal layer avoid the possibility of contamination with oxygen in the LED active region upon regrowth as well as provide a passivation layer on the barrier layer 111. The openings 121, 122 through mask layer 120 may be circular or otherwise, and may be repeated regularly with a hexagonal lattice or other arrangements or may be disposed irregularly with different shapes and sizes. The openings may 121, 122 be produced by dry etching of the mask layer 120 with appropriate chemistry following a lithographic patterning step.

A second semiconductor layer 130 may be selectively deposited on the openings 121, 122 of the mask layer 120 in contact with the first semiconductor layer 110. As shown in FIG. 3, the second semiconductor layer 130 may comprise a plurality of structures which are discontinuous. The second semiconductor layer 130 is formed from a Group III-nitride, for example GaN. Preferably the second semiconductor layer 130 is n-type doped, for example with Si or Ge impurities, or any other suitable electron donor. The second semiconductor layer 130 is formed on the first semiconductor layer 110 such that it is in electrical contact with the electron channel 112. Thus a plurality of monolithic LED structures may be formed on the first semiconductor layer 110. The monolithic LED structures may be precursors to LEDs formed from Group III-nitrides which are each monolithically integrated with a HEMT for driving the LED.

As shown in the embodiment of FIG. 3, each monolithic LED structure may comprise a plurality of layers. As such, each monolithic LED structure may include a third semiconductor layer 140 selectively deposited on the second semiconductor layer 130. The third semiconductor layer 140 may comprise one or more quantum well layers (not shown). The quantum well layers within the third semiconductor layer 140 may comprise a Group III-nitride semiconductor, preferably a Group III-nitride alloy including In. A fourth semiconductor layer 150 may also be selectively laminated on the third semiconductor layer 140. The fourth semiconductor layer 150 may be a p-type doped Group III-nitride, for example Mg-doped GaN. A contact layer 160 may also be selectively deposited on the fourth semiconductor layer 150 in electrical contact with at least a portion of top surface of the fourth semiconductor layer 150. As such, each of the LED structures formed may be a precursor to a micro LED forming part of a micro LED array. The formation of each of the LED structures having a regular trapezoidal-cross section is discussed in more detail in GB 1811109.6.

The gate contact 170 for each HEMT is deposited over the barrier layer. In the embodiment of FIG. 3, the gate contact 170 for each HEMT is deposited on the surface of the barrier layer on an opposite side to the first semiconductor layer 110. Each gate contact 170 may be deposited over, but not necessarily in contact with a portion of the barrier layer 111, so as to encircle each monolithic LED structure. As such, in the embodiment of FIG. 3 the gate contact 170 encircles the semiconductor layer stack formed by the second semiconductor layer 130, the third semiconductor layer 140 and the fourth second semiconductor layer 150 for the purpose of providing a gate contact for the electron channel 112 at the interface between the first semiconductor layer 110 and the barrier layer 111. It is understood that each gate contact 170 in the array is disjoined from the other gate contacts 170 (i.e. not formed from a continuous layer) so that each gate contact 170 may be controlled independently. Preferably, the plurality of (disjoined) gate contacts 170 are deposited in a single layer across the active matrix LED array precursor.

In a preferred embodiment of the present invention, LED-defining openings 121 are provided for the purpose of fabricating micro LED structures. In addition to the LED-defining openings 121, smaller source contact-defining openings 122 may also be provided. The source contact-defining openings allow for the formation of an electrical contact to the electron channel 112 of the first semiconductor layer 110. In a preferred embodiment, a plurality of source contacts 130b may be selectively deposited on the first semiconductor layer 110 through the source contact-defining openings 122. As such, the source contacts 130b are source vias configured to extend through the barrier semiconducting layer 111 to the first semiconductor layer 110.

As shown in FIG. 3, the source contacts 130b may also be formed from the same material as the second semiconductor used to provide the second semiconductor layer 130a for the monolithic LED structure. As such, the source contact to the electron channel 112 of each HEMT may be formed monolithically with the first semiconductor layer 110. In some embodiments, the source contacts 130b may be formed as part of the same selective fabrication step as the second semiconductor layer 130a for the monolithic LED structures 20. In other embodiments, the openings 121, 122 and the second semiconductor layers 130a, 130b may be formed in separate steps. It will be appreciated that the relatively smaller size of the source-defining opening 122 results in a different shaped columnar structure being formed for the source defining contacts 130b.

Further interconnection between the source contacts 130b and any external circuitry may be provided by a source interconnection layer 180. The source interconnection layer 180 may be provided as a layer of electrical contacts deposited over the source defining contacts 130b and the mask layer 120. As shown in FIG. 3, the source contacts 130b may extend each through source contact-defining opening 122 above the surface of mask layer 120, thereby providing an electrical connection between the surface of the mask layer 120 and the electron channel 112. The source interconnection layer 180 can then be deposited over the source contacts 130*b*. The source interconnection layer 180 may be formed from any suitable metal interconnect material, for example Cu, Al, or a layered stack of Ti and Al.

In an alternative embodiment, the source contact to each electron channel 112 may be made by a metallic contact. As such, a metallic contact may be deposited on the barrier layer 111/mask layer 120 and may be a stack of a Ti/Al/Ni/Au that is annealed at high temperature to form an electrical contact with the electron channel layer 112 at the interface between the first semiconductor layer 110 and the barrier layer 111 through the barrier layer 111.

The gate contact 170 for each transistor-driven LED precursor 12 may be provided on the mask layer 120. Preferably, each gate contact 170 is formed from one or more metallic layers. For example, the gate contact may be a Ni/Au stack, a Ti/Au, or a Mo/Ti/Au stack, or indeed any combination of materials suitable for providing a gate contact for controlling the carrier density in the electron channel layer 112. The design of HEMTs and the selection of appropriate materials are well known to the skilled person, and so are not further discussed herein. The gate contacts 170 may be deposited directly in contact with the mask layer 120 as shown in FIG. 3. Alternatively, the gate contact layer 170 may be laminated on a recess protruding through the mask layer 120 or, alternatively, partially or completely through the semiconductor barrier layer 111 as shown in FIG. 6.

As is known in the art, the design of the barrier layer and gate contact design may be adapted to provide a HEMT which is either normally on, or normally off. That is to say, for a normally off HEMT it is understood that under no applied bias the electron channel layer 112 proximal to the gate may be substantially depleted of mobile charge carriers (i.e. the density of mobile charge carriers is reduced). As such, for a normally off HEMT (enhancement mode), the design of gate may "quench" the electron channel layer 112 formed between the first semiconductor layer 110 and the barrier layer 111.

For a normally on HEMT, it is understood that under no applied bias the electron channel layer 112 extends between the source contacts 130*b* and the drain (the monolithic LED structure). Under an applied bias to the gate contact, the electron channel 112 proximal to the gate contact 130 may be depleted of mobile charge carriers.

Figure 6:
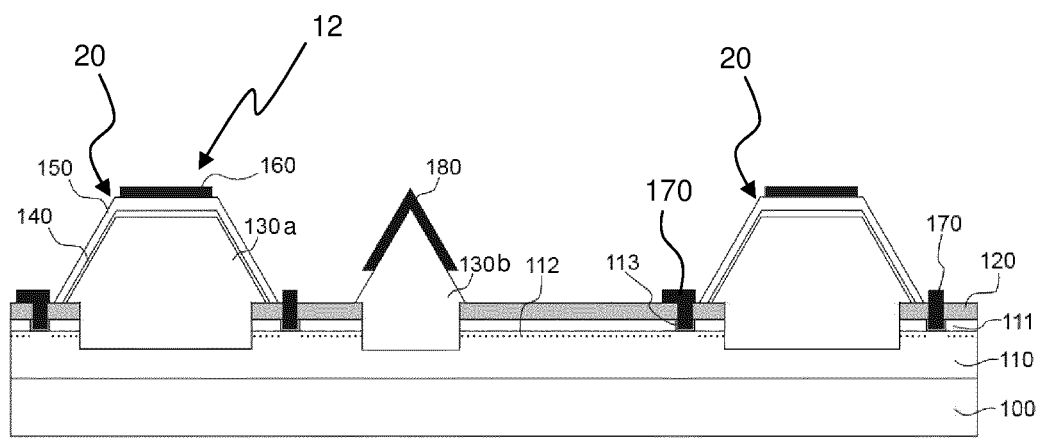
FIG. 6 shows a cross section of an active matrix LED array precursor according to another embodiment of the disclosure.

In the embodiment of a normally-off HEMT shown in FIG. 6, a further thin insulating layer 113 may present between the gate contact layer 170 and the first semiconductor layer 110 for the purpose of insulating the gate contact from the electron channel layer 112 and reducing gate leakage in a MIS-HEMT configuration.

In an alternative implementation of a normally-off HEMT, a p-type semiconductor layer may be laminated between the gate contact layer 170 and the semiconductor barrier layer 111 selectively under the gate contact 170 such that the electron channel layer 112 proximal to the gate may be substantially depleted of mobile charge carriers. In a yet further alternative implementation of a normally-off HEMT, a fluorine-containing plasma treatment may be performed locally under the gate contact layer 170 on the barrier layer 111 for the purpose of doping the barrier layer 111 with negatively-charged F ions and locally turning off the electron channel 112 in the treated region. The above described techniques for providing normally on, or normally off HEMTs are well known in the art and so are not further described herein.

In some embodiments, the barrier layer 111 comprises a plurality of sublayers formed from Group III-nitrides. In one preferred embodiment, the barrier layer comprises a first sub layer and a second sub layer. The second sub layer may be provided between the first sub layer and the first common semiconductor layer. As such, the second sub-layer may be a spacer layer. The first and second sub-layers may be formed from Group III-nitrides. The compositions of the first and second sub-layers may be configured to optimise the resistivity of the electron channel layer of the HEMT. For example, in one embodiment, the first sub layer may be formed from substantially $Al_xGa_{1-x}N$ substantially as described above and the second sub layer formed from undoped AlN. The second sub layer may be relatively thinner than the first sub layer, for example the second sub layer may be at least 0.5 nm thick or no greater than 5 nm thick, preferably about 1 nm thick.

One possible layout of the gate contacts 170 on the mask layer 120 is shown in FIG. 4. In the embodiment shown in FIG. 4, the monolithic LED structures are grown as generally hexagonal columnar structures. As shown in FIG. 4, each gate contact 170 encircles a monolithic LED structure. Each of the gate contacts 170 encircling a monolithic LED structure are disjoined from the other gate contacts 170 so that each gate contact may be controlled independently. A plurality of source contacts 130*b* are distributed in the spaces between the array of monolithic LED structures. As such each source contact 130*b* may supply electrons to a plurality of the monolithic LED structures via the electron channel layer 112 of the HEMT. The source contacts 130*b* are also themselves electrically interconnected by the electron channel layer 112 away from the gate contacts. Thus it is understood that the one or more source contacts 130*b* provide a common source contact to the plurality of transistor-driven LED precursors 12.

Accordingly, it will be appreciated that the combination of the first semiconductor layer 110, semiconductor barrier layer 111, in addition to the gate contact layer 170 and source interconnection layer 180 constitute part of a high electron mobility transistor (HEMT) structure for the purpose of integrating a driving transistor matrix with the micro LED matrix.

The HEMT structure is such that a voltage applied between gate contact layer 170 and the source interconnection layer 180 modulates the resistance of the electrical path connecting the source interconnection layer 180/source contact 130*b* through the electron channel layer 112 and the second semiconductor layer 130. Depending on the specific implementation of the HEMT structure, a negative voltage applied between the gate contact layer 170 and the source contact 130*b* may deplete the electron channel layer 112 in correspondence of the gate contact layer 170 thereby electrically isolating a disjoined portion of the second semiconductor layer 130*a* from source interconnection layer 180/source contact 130*b* in a device configuration known among those skilled in the art as depletion-mode or normally-on HEMT. Alternatively, a positive voltage applied between the gate contact layer 170 and the source contact 130*b* may increase the electron concentration in the electron channel layer 112 in correspondence of the gate contact layer 170 thereby electrically connecting a normally electrically isolated disjoined portion of the second semiconductor layer 130*a* with a source contact 130*b* in a device configuration known among those skilled in the art as enhancement-mode or normally-off HEMT.

Figure 5:
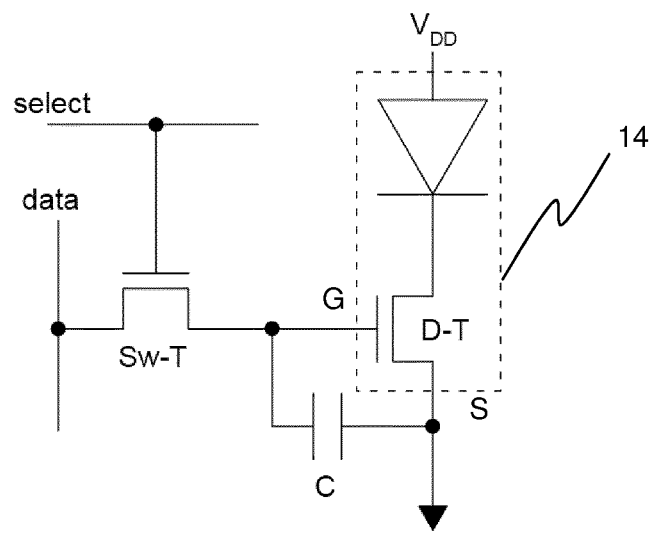
FIG. 5 shows a circuit diagram of a 2T+1C active matrix circuit for an active matrix LED array precursor according to an embodiment of the disclosure.

The above described embodiments may provide a plurality of transistor-driven LED precursors for use in an active matrix micro LED array. FIG. 5 is a circuit diagram showing of a single pixel of the active matrix micro LED array according to embodiments of the disclosure. FIG. 5 shows the electrical connections between a transistor-driven micro LED 14 and the switching transistor (Sw-T) and capacitor (C) for a single pixel of an active matrix display according to the present disclosure. The transistor-driven micro LED structure 14 of FIG. 5 comprises a micro LED and a HEMT which are monolithically integrated within the same Group III-nitride epitaxial stack. Further connections may be added to the above described structure in order to provide the connections towards components and terminals external to the epitaxial stack, in particular the connection between micro LED anode and the power source ($V_{DD}$), between the driving transistor (D-T) source (S) and the ground connection, and between driving transistor gate (G) and switching transistor (Sw-T) source as well as the connections of the capacitor (C) at the driving transistor (D-T) gate (G) and ground (S). FIG. 5 also shows that the gate of the switching transistor (Sw-T) is connected to a common select line for all of the pixels in a row of the array. The drain of the switching transistor (Sw-T) is connected to a common data line for all of the pixels in a column of the array.

Figure 7:
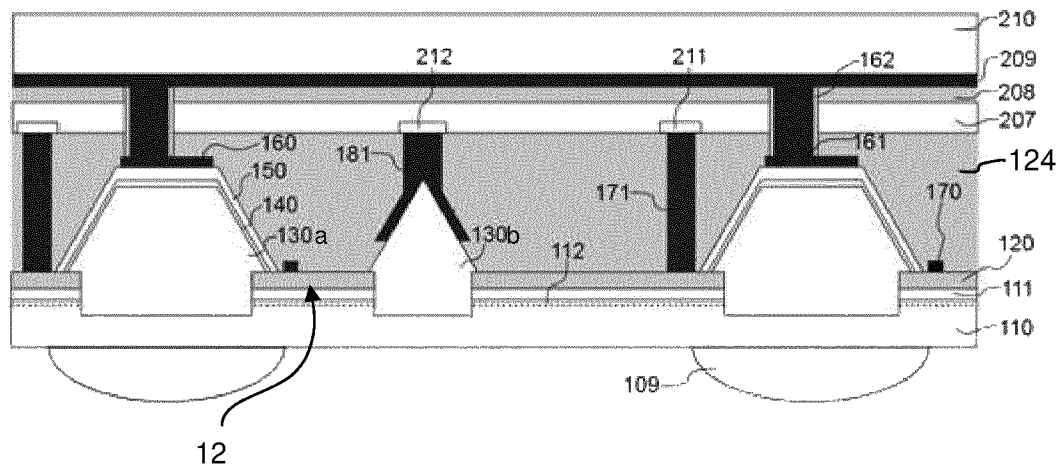
FIG. 7 shows a cross sectional side-view of a planarised active matrix LED array precursor according to a further embodiment of the present disclosure.

FIG. 7 is a cross-sectional side-view of a planarised active matrix LED array precursor according to a further embodiment of the present disclosure. In this embodiment the array of transistor-driven LED precursors 12 have been been coated with a gap-filling insulator 124 that has been subsequently planarised. The planarised gap-filling insulator 124 provides a flat (planarised) surface suitable for the deposition of further thin film electronic circuitry. For example the further thin film circuitry deposited on the planarised surface may include a plurality of thin film transistors (TFTs). Said TFTs may be arranged in matrix in order to provide the further circuitry of the 2T+1C structure shown in FIG. 5. The thin film circuitry is schematically represented as layer 207 in FIG. 7.

As schematically shown in FIG. 5, the TFT matrix comprises a switching transistor and a capacitor corresponding to each transistor-driven LED precursor 12 in the array. Thus, the thin film circuitry layer 207 may comprise a thin film switching transistor and a capacitor for each pixel in the array. Via contacts 171, 181 may be provided to electrically connect each transistor driven LED precursor 12 to the surface of the planarised gap-filling insulator. As such, a first via contact 171 may provide between each gate contact 170 and a source contact of a TFT in the thin film circuitry layer 207. A second via contact 181 may be provided between each source contact 130b and/or source interconnection layer 180 and the surface of the planarised gap filling insulator. A thin film capacitor may be provided between on the planarised surface in electrical connection with the first and second via contacts 171, 181. The thin film circuitry layer 207 further may also comprise data lines and control lines (not represented) for independent pixel addressing as schematically shown in FIG. 5 for a single pixel cell. As such, the planarised LED array precursor can provide a suitable substrate on which a 1T+1C active matrix structure may be fabricated using thin film electronic devices. Thus, the 2T+1C structure may be fabricated on a single substrate thereby reducing reliance on mechanical connections to provide an active matrix array.

The gap-filling insulator 124 may be planarised using a chemical-mechanical planarization (CMP) process. The first and second via contacts 171, 181 may be obtained by metal lift-off, metal etch or Cu electroplating depending on the via height and aspect ratio in the particular implementation of the current disclosure. These processes are well known in the art and so are not further described herein.

The embodiment in FIG. 7 also includes an insulating layer 208 deposited on the thin film circuitry layer 207 to electrically insulate the thin film circuitry layer. The array has also been bonded to a handle wafer 210 via a common anode contact layer 209. A third via contact 161 through the thin film circuitry layer 207 has been provided to electrically connect the anode contacts 160 of the micro LED array to a common anode contact 209 on the handle wafer. The anode via contacts 161 are electrically insulated from the TFT layer 207 with an insulating layer 162.

Furthermore, in the embodiment of FIG. 7 the growth substrate has been removed and light-extracting features 109 have been provided aligned with the micro LED anode contacts 160. It is noted that the thin film circuitry layer 207 is located away from the path of the light emitted in the micro LED array and extracted through the light-extracting features 109. As a consequence, any TFT technology, including non-transparent TFTs such as a-Si and polycrystalline Si can be employed in the thin film circuitry layer 207 according to this device architecture. It is also noted that all the disjoined portions of the source contacts 130b can be electrically connected with additional metal connections (e.g. source interconnection layer 180 not shown) completely contained within the insulating gap-filling layer 121 and running around the micro LED pixels. These additional connections between the source contacts 130b aids current spreading within a large pixel array and can be located away from the path of the generated light in the micro LED array thereby not affecting the light-extraction efficiency of the array.

Figure 8:
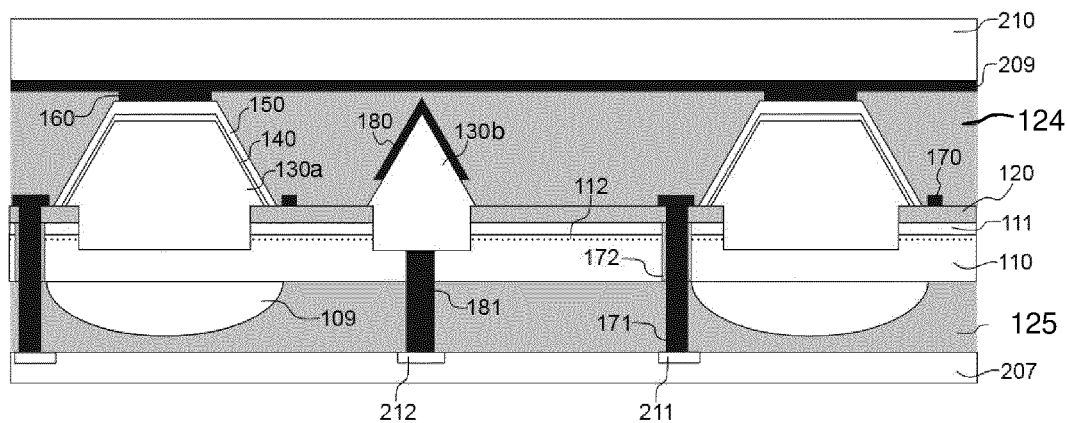
FIG. 8 is a cross-sectional side-view of an active matrix micro LED array according to a yet further embodiment of the present disclosure.

FIG. 8 is a cross-sectional side-view of an active matrix micro LED array according to a yet further embodiment of the present disclosure. In this embodiment, the micro LED and driving transistor array has been coated with a gap-filling insulator 124 and planarised to facilitate bonding to a handle wafer 210 via a common anode contact layer 209. Furthermore, the growth substrate has been removed and light-extracting features 109 have been provided aligned with the micro LED anode contacts 160. As such, the light extracting features 109 are provided on a surface of the first semiconducting layer 110 opposite the surface of the first semiconducting layer on which the barrier layer 111 is provided.

In this embodiment, the light extracting features have also been planarised with a second gap-filling transparent insulating layer 125. Thus a planarised surface for the deposition of a thin film electronics layer 207 is provided (schematically represented in FIG. 8). Thus, by contrast to the embodiment of FIG. 7, the thin film electronics layer 207 is provided on an opposite side of the first semiconducting layer 110. As such, it will be appreciated that the thin film electronics layer may be provided in number of different locations relative to the first semiconducting layer 110.

As schematically shown in FIG. 5, the thin film electronics layer 207 may comprise a switching transistor and a capacitor similar to the embodiment of FIG. 7. First and second via contacts 171 and 181 extend between the thin film electronics layer 207 and the gate layer 170 and source contact 130b of the driving transistor respectively. The gate via contacts 171 are electrically insulated from the electron channel layer 112 with an insulating layer 172 for the purpose of avoiding gate leakage. The thin film electronics layer 207 further contains data lines and control lines (not represented) for independent pixel addressing as schematically shown in FIG. 5 for a single pixel cell.

In this embodiment the thin film electronics layer 207 is located in the path of the light emitted in the micro LED array and extracted through the light-extracting features 109. As a consequence, any thin film transistor technology employed with this device architecture preferably employs transparent channel materials such as ZnO or In—Ga—Zn—O (IGZO) or Al—Sn—Zn—O (ATZO) and transparent contacts such as ITO whenever possible. It is also worth noting that all the disjoined portions of the source contacts 130b can be electrically connected with additional metal connections (not shown) completely contained within the insulating gap-filling layer 121 and running around the micro LED pixels (i.e. source interconnection layer 180). These additional connections between source contacts 130b aids current spreading within a large pixel array and are located away from the path of the generated light in the micro LED array thereby not affecting the light-extraction efficiency of the array.

Figure 9:
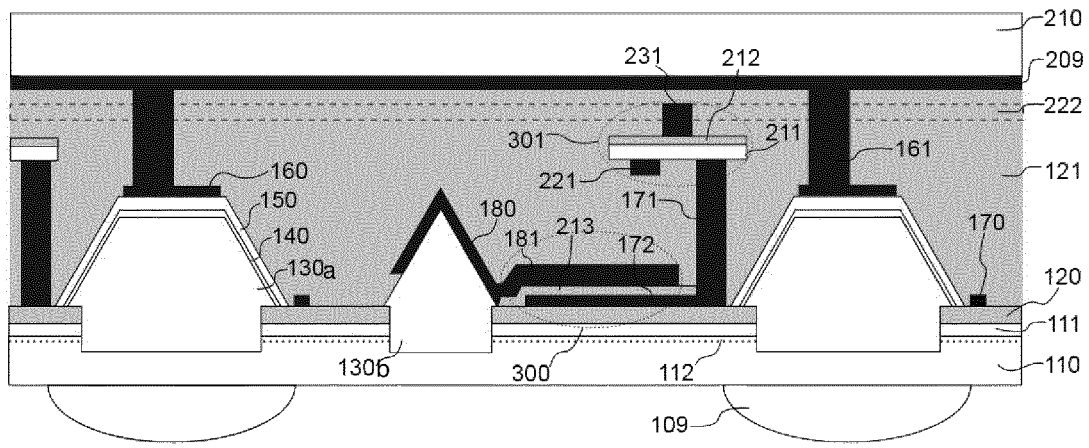
FIG. 9 a cross-sectional side-view of an active matrix micro LED array according to another further embodiment of the present disclosure.

FIG. 9 is a cross-sectional side-view of an active matrix micro LED array according to another further embodiment of the present disclosure.

In the embodiment of FIG. 9, the gate contact and source contact for each transistor-driven LED precursor are configured to provide a capacitor between the gate of the HEMT to and the source of the HEMT. As shown in FIG. 9, a first portion of the gate contact 172 and a second portion of the source contact 181 overlap to form a capacitor. In the embodiment shown in FIG. 9, the first portion 172 and the second portion 181 are provided as overlapping layers, separated by a dielectric layer 213. As such, the first and second portions 172, 181 form a thin film capacitor. Other arrangements of thin film capacitors known to the skilled person may also be used. Advantageously, by providing the thin film capacitor on the mask layer 120, the integration of the active matrix circuitry may be integrated more closely with the LED array.

Figure 10:
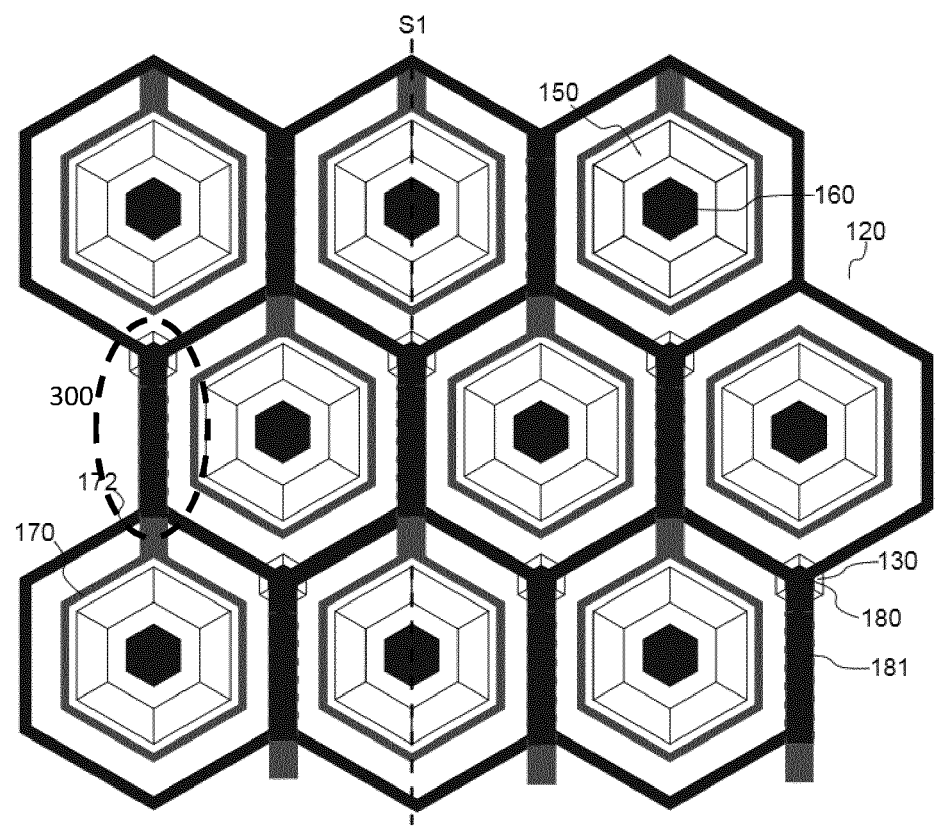
FIG. 10 shows a plan view of a layout of the gate and source contacts for the embodiment of FIG. 9.

FIG. 10 shows a plan view of a layout of the gate and source contacts for the embodiment of FIG. 9. As shown in FIG. 10, each of the gate contacts 170 encircles a monolithic LED structure 150. As such, each of the gate contacts encircles a monolithic LED in a similar manner to the layout of FIG. 4. In the embodiment of FIG. 10, the common source contact is provided by the plurality of source contacts 130b and the source interconnection layer 180. As shown in FIG. 10, the source interconnection layer 180 encircles each of the monolithic LED structures 150. The source interconnection layer 180 also encircles each of the gate contacts 170. As such, the common source contact encircles each of the monolithic LED structures 150 and each of the gate contacts 170. Accordingly, the common source contact 170 may comprise a single continuous layer which is deposited over the mask layer. By providing a single common source contact to each of the LEDs, current spreading to each of the LEDs may be improved.

As shown in FIG. 10, the source interconnection layer 180 and each gate contact 170 may overlap in a region 300 in order to define the gate-source capacitor of the 2T+1C active matrix circuit.

In the embodiment of FIG. 10, each gate contact further comprises a first portion 172. The first potion 172 is covered with a thin conformal dielectric 213. For example, the thin conformal dielectric may be $SiO_2$, $SiN_x$, $HfO_2$, or $Al_2O_3$, preferably deposited by Atomic Layer Deposition. Preferably, the thin conformal dielectric may be formed from a material having a relatively high dielectric constant (a high κ dielectric) in order to reduce the size of the capacitor. For example, the thin conformal dielectric may be $HfO_2$, or $Al_2O_3$. The source interconnection layer 180 may then be deposited in contact with a portion of the second semiconductor layer forming the source contact 130b. The source interconnection layer 180 comprises a second portion 181 extending directly above the sequence of conformal dielectric 213 and first portion 172 of each gate contact to form a capacitor connected to HEMT source and HEMT gate 170 (the capacitor is highlighted in the image as 300).

As shown in FIG. 10, and also in FIG. 4, each gate contact 170 and/or the source interconnection layer 180 encircles each monolithic LED structure 20 in the shape of a polygon. In the embodiment of FIG. 10, each gate contact 170 and source interconnection layer 180 encircles a monolithic LED source structure 20 by forming a hexagonal shape. Accordingly, the array of micro LEDs may be provided in a hexagonally close-packed array. Of course, in other embodiments, it will be appreciated that other shapes for the each gate contact 170 and/or source interconnection layer 180 may be provided. For example, the contacts may be provided in a square or rectangular shape. In some embodiments a combination of different polygon shapes may be provided in a pattern in order to form an array.

As further shown in FIG. 9, a thin film transistor (TFT) 301 may also be integrated into each pixel of an active matrix LED array precursor structure in addition to the gate-source capacitor 300. The TFT 301 may be connected to the gate contact 170 of the HEMT in order to act as the switching transistor for the pixel (as shown in FIG. 5).

As shown in the embodiment of FIG. 9, in addition to the gate source capacitor 300, gate contact via 171 and anode 161 via may be extended to a planarised surface. As such, a planarised surface similar to the embodiments of FIGS. 7 and 8 may be provided on which to form the TFT 301

A data line 221 may initially be deposited on the planarised surface. The data line may be formed from a metal, e.g. Cu or Al. Subsequently, a channel layer 211 may be deposited in electrical contact with the data line. The channel layer may be formed from any suitable semiconductor known for use in a TFT, for example a-Si or ZnO doped with Indium and/or Ga, preferably both. IGZO based TFTs are well known in the art and are not further discussed herein. The channel layer is in contact with the data line 221 (as drain of the Sw-TFT) and the HEMT gate contact 171 (as source of the Sw-TFT). A thin conformal dielectric 212 is deposited on the channel layer followed by a TFT gate contact 231 which is connected with the control line 222.

Accordingly, the embodiment of FIG. 9 provides a switching TFT 301 and a capacitor 300 integrated with a micro LED+HEMT as part of an array of micro LEDs. As such, the 2T+1C active matrix circuitry is integrated into the same monolithic substrate as the LED array and driving transistor. Furthermore, by integrating the switching TFT 301 and the capacitor 300 on different planes (i.e. three dimensional integration), the compactness of the active matrix circuitry and micro LED array may be further increased.

Although preferred embodiments of the invention have been described herein in detail, it will be understood by those skilled in the art that variations may be made thereto without departing from the scope of the invention or of the appended claims

The invention claimed is:

1. An active matrix LED array precursor comprising:
   a common first semiconducting layer comprising a substantially undoped Group III-nitride;
   a plurality of transistor-driven LED precursors, each transistor-driven LED precursor comprising:
   a monolithic light emitting diode (LED) structure comprising a plurality of III-nitride semiconducting layers, each monolithic LED structure formed on a portion of the common semiconducting layer;

a barrier semiconducting layer formed on a portion of the common semiconducting layer encircling the LED structure configured to induce a two-dimensional electron channel layer at the interface between the common semiconducting layer and the barrier semiconducting layer; and a gate contact formed over a portion of the two-dimensional electron channel layer, the gate contact encircling the LED structure; and a common source contact configured to form an ohmic contact to each two-dimensional electron channel layer such that a high electron mobility transistor is provided between the common source contact and each monolithic LED structure for driving each LED structure.

2. An active matrix LED array precursor according to claim 1, wherein each transistor-driven LED precursor further comprises a capacitor formed between a portion of the common source contact and a portion of each gate contact.

3. An active matrix LED array precursor according to claim 2, wherein the portions of the gate contact layer and the common source contact layer forming each capacitor overlap, separated by a dielectric layer.

4. An active matrix LED array precursor according to claim 1, wherein each transistor driven LED precursor further comprises an insulating mask layer provided between each gate contact and the barrier semiconducting layer.

5. An active matrix LED array precursor according to claim 1, wherein the common source contact encircles each of the monolithic LED structures and the gate contacts.

6. An active matrix LED array precursor according to claim 1, wherein the barrier semiconducting layer comprises a plurality of sublayers formed from Group III-nitrides.

7. An active matrix LED array precursor according to claim 1, wherein the common source contact comprises a plurality of source vias, each source via configured to extend through the barrier semiconducting layer to the common first semiconductor layer.

8. An active matrix LED array precursor according to claim 7, wherein the monolithic LED structure comprises a second semiconductor layer extending from the first semiconducting layer in a column; and wherein each source via is a monolithic source structure comprising the second semiconductor layer extending from the first semiconducting layer in a column.

9. An active matrix LED array precursor according to claim 1, wherein the monolithic LED structure comprises:

(i) a second semiconductor layer on the common first semiconductor layer, having an upper surface portion parallel to the plane of the LED array precursor, the second semiconductor layer having a regular trapezoidal cross-section normal to the upper surface portion, such that the second semiconductor layer has sloped sides;

(ii) a third semiconductor layer on the second semiconductor layer, having an upper surface portion parallel to the plane of the LED array precursor, the third semiconductor layer formed on the second semiconductor layer such that the second and third semiconductor layers have a regular trapezoidal cross-section normal to the upper surface portion, such that the third semiconductor layer has sloped sides parallel to the sloped sides of the second semiconductor layer;

(iii) a fourth semiconductor layer on the third semiconductor layer, having an upper surface portion parallel to the plane of the LED array precursor, the fourth semiconductor layer formed on the third semiconductor layer such that the second, third, and fourth semiconductor layers have a regular trapezoidal cross-section normal to the upper surface portion, such that the fourth semiconductor layer has sloped sides parallel to the sloped sides of the third semiconductor layer; and (iv) a primary electrical contact on the fourth semiconductor layer, wherein the contact is only on the upper surface portion of the fourth semiconductor layer which is parallel to the plane of the LED array precursor;

wherein the first to fourth semiconductor layers comprise Group III-nitrides, and the third semiconductor layer comprises a plurality of quantum well sub-layers, the quantum well sub-layers having a greater thickness on a portion parallel to the plane of the LED array precursor and a reduced thickness on a portion which is not parallel to the plane of the LED array precursor.

10. An active matrix LED array precursor according to claim 1, wherein the barrier semiconducting layer of each transistor driven LED precursor is provided as a common barrier semiconducting layer.

11. The active matrix LED array precursor of claim 1; in combination with a gap-filling insulator layer provided over a surface of the common semiconductor layer on which the plurality of transistor-driven LED precursors are provided, the gap-filling insulator configured to define a substantially planarised surface for the fabrication of electronic devices thereon incorporated into a planarised active matrix LED precursor.

12. The active matrix LED array precursor of claim 11, further comprising:

a plurality of thin film transistors formed on the substantially planarised surface of the gap filling insulator, each thin film transistor in electrical contact with a gate contact of a transistor-driven LED precursor, the plurality of thin film transistors forming part of an active matrix circuit.

13. A method of forming an active matrix LED array precursor comprising:

(i) providing a substrate having a surface;

(ii) forming a continuous first semiconductor layer on the surface of the substrate, the first semiconducting layer comprising substantially undoped Group III-nitride, (iii) forming a barrier layer on the first semiconductor layer, the barrier layer configured to induce a two-dimensional electron channel layer at the interface between the first semiconductor layer and the barrier layer;

(iv) selectively masking the barrier layer by depositing a masking layer comprising a plurality of LED-defining apertures;

(v) selectively removing unmasked portions of the barrier layer and the first semiconductor layer to expose a portion of the first semiconductor layer through each of the LED-defining apertures;

(vi) forming a monolithic LED structure comprising a plurality of Group III-nitride semiconducting layers on unmasked portions of the first semiconductor layer through the LED-defining apertures such that each monolithic LED structure is encircled by the two-dimensional electron channel layer, (vii) forming a plurality of gate contacts, the gate contacts formed over portions of the two-dimensional electron channel layer, each gate contact encircling a monolithic LED structure; and (viii) forming a common source contact, the common source contact configured to provide an ohmic contact to each portion of the two-dimensional electron channel layer such that a plurality of transistor-driven LED precursors are formed comprising high electron mobility transistors between the common source contact and each monolithic LED structure.

14. A method of forming an active matrix LED array precursor according to claim 13 further comprising forming a plurality of capacitors, each capacitor formed between a portion of the common source contact and a portion of each gate contact.

15. A method of forming an active matrix LED array precursor according to claim 14, wherein the portions of the gate contacts and the portions of the common source contact forming the each capacitor are formed so that they overlap.

16. A method of forming an active matrix LED array precursor according to claim 14, wherein the step of forming a plurality of capacitors further comprises forming a dielectric layer separating the portions of the common source contact and the portions of each gate contact.

17. A method of forming an active matrix LED array precursor according to claim 13, wherein forming the common source contact comprises forming the common source contact such that it encircles each of the monolithic LED structures and the gate contacts.

18. A method of forming an active matrix LED array precursor according to claim 13, wherein the barrier layer comprises a plurality of sublayers formed from Group III-nitrides.

19. A method of forming an active matrix LED array precursor according to claim 13, wherein forming a monolithic LED structure comprising a plurality of Group III-nitride semiconducting layers on unmasked portions of the first semiconductor layer through the LED-defining apertures further comprises:

growing a second semiconductor layer comprising a Group III-nitride on unmasked portions of the first semiconductor layer through the LED-defining apertures to form a plurality of columns for a monolithic LED structure encircled by the two-dimensional electron channel layer.

20. A method of forming an active matrix LED array precursor according to claim 13, wherein forming the common source contact comprises:

forming a plurality of source vias, each source via configured to extend through the barrier semiconducting layer to the common first semiconductor layer.

21. A method of forming an active matrix LED array precursor according to claim 20, wherein forming the plurality of source vias comprises:

selectively masking the barrier layer by depositing a masking layer further comprising a plurality of source-defining apertures;

selectively removing unmasked portions of the barrier layer and the first semiconductor layer to expose a portion of the first semiconductor layer through each of the source-defining apertures;

growing a second semiconductor layer on unmasked portions of the first semiconductor layer through the source-defining apertures of the masking layer to form a plurality of columns extending through the masking layer configured to provide a source contact to each portion of the two-dimensional electron channel layer.

22. A method of forming an active matrix LED array precursor according to claim 13, wherein the monolithic LED structure comprises:

(i) a second semiconductor layer on the common first semiconductor layer, having an upper surface portion parallel to the plane of the LED array precursor, the second semiconductor layer having a regular trapezoidal cross-section normal to the upper surface portion, such that the second semiconductor layer has sloped sides;

(ii) a third semiconductor layer on the second semiconductor layer, having an upper surface portion parallel to the plane of the LED array precursor, the third semiconductor layer formed on the second semiconductor layer such that the second and third semiconductor layers have a regular trapezoidal cross-section normal to the upper surface portion, such that the third semiconductor layer has sloped sides parallel to the sloped sides of the second semiconductor layer;

(iii) a fourth semiconductor layer on the third semiconductor layer, having an upper surface portion parallel to the plane of the LED array precursor, the fourth semiconductor layer formed on the third semiconductor layer such that the second, third, and fourth semiconductor layers have a regular trapezoidal cross-section normal to the upper surface portion, such that the fourth semiconductor layer has sloped sides parallel to the sloped sides of the third semiconductor layer; and (iv) a primary electrical contact on the fourth semiconductor layer, wherein the contact is only on the upper surface portion of the fourth semiconductor layer which is parallel to the plane of the LED array precursor;

wherein the first to fourth semiconductor layers comprise Group III-nitrides, and the third semiconductor layer comprises a plurality of quantum well sub-layers, the quantum well sub-layers having a greater thickness on a portion parallel to the plane of the LED array precursor and a reduced thickness on a portion which is not parallel to the plane of the LED array precursor.

23. A method of forming an active matrix LED precursor according to claim 13, further comprising forming a gap-filling insulator layer over a surface of the first semiconducting layer on which the plurality of transistor-driven LED precursors are provided, the gap-filling insulator configured to define a substantially planarised surface for the fabrication of electronic devices thereon.

24. A method of forming an active matrix LED array precursor according to claim 23, further comprising forming a plurality of thin film transistors on the substantially planarised surface of the gap filling insulator, each thin film transistor in electrical contact with a gate contact of the transistor-driven LED precursor, the plurality of thin film transistors forming part of an active matrix circuit.

* * * * *